United States Patent
Keating

[19]

[11] Patent Number: 5,867,068
[45] Date of Patent: Feb. 2, 1999

[54] FREQUENCY SYNTHESIZER USING DOUBLE RESOLUTION FRACTIONAL FREQUENCY DIVISION

[75] Inventor: Pierce V. Keating, Pompano Beach, Fla.

[73] Assignee: Motorola, Inc., Schaumburg, Ill.

[21] Appl. No.: 958,505

[22] Filed: Oct. 27, 1997

[51] Int. Cl.[6] .......................... H03K 23/00; H03K 23/66; H03L 7/18
[52] U.S. Cl. .............. 331/1 A; 331/16; 331/25; 377/48; 327/107; 327/159
[58] Field of Search ................ 331/1 A, 16, 18, 331/25; 377/47, 48, 107, 108, 115, 116, 118, 119; 327/105, 107, 156–159

[56] References Cited

U.S. PATENT DOCUMENTS

| | | | |
|---|---|---|---|
| 3,943,379 | 3/1976 | McGuffin | 307/225 |
| 4,348,640 | 9/1982 | Clendening | 328/41 |
| 4,366,394 | 12/1982 | Clendening et al. | 307/225 R |
| 4,399,549 | 8/1983 | Srivastava | 377/108 |
| 5,040,197 | 8/1991 | Theobald | 377/48 |
| 5,305,362 | 4/1994 | Miller | 377/48 |

*Primary Examiner*—David Mis
*Attorney, Agent, or Firm*—Andrew S. Fuller

[57] ABSTRACT

A fractional frequency synthesizer (100) includes a symmetrical divider (165) having an output frequency signal (135) fractionalized based on half cycles of its input frequency signal (130). The divider (165) is provided with a divisor (145) that varies based on half cycles of the output signal. Preferably, the divider (165) operates to selectively add or subtract an increment, corresponding to one half cycle of the input frequency signal (130), to a half cycle of the output frequency signal (135).

12 Claims, 11 Drawing Sheets

5,867,068

FREQUENCY SYNTHESIZER USING DOUBLE RESOLUTION FRACTIONAL FREQUENCY DIVISION

TECHNICAL FIELD

This invention relates in general to frequency synthesizers, and more particularly to fractional frequency synthesizers.

BACKGROUND OF THE INVENTION

Frequency synthesizers have traditionally made use of loop dividers which are designed to operate on an output frequency signal of a voltage controlled oscillator (VCO). Integer frequency synthesizers generally use loop dividers which divide an input frequency to a lower output frequency using a complete input frequency cycle period, or two pi (2π) radians, as the minimum unit of resolution. Fractional frequency synthesizers also employ frequency loop dividers which use 2π radians as the minimum unit of resolution. Typically, the loop dividers used in fractional frequency synthesizers obtain a fractional frequency divide value by periodically changing the integer value of loop divider so that, over several cycles of the output waveform, the average divide includes a fractional component. While the method of averaging a loop divider value does produce an output signal at the desired divided down frequency, lower frequency subharmonics are also present in the output. The subharmonic frequency components are not desirable in frequency synthesizers since they introduce unwanted noise energy in the output spectrum. Often, the subharmonic frequency components must be attenuated by low pass filtering within the frequency synthesizer, which consequently increases the lock time, and decreases VCO sideband noise attenuation. The practice of dividing, and fractionalizing a divided value in units of complete input clock cycles results in low frequency, and relatively large amplitude subharmonic spurs, which require such filtering. It would be beneficial to develop a method by which a fractional frequency synthesizer would produce subharmonic spurs that occur at higher frequencies and at smaller amplitudes. This would reduce filtering requirements and improve synthesizer performance.

DETAILED DESCRIPTION OF THE PREFERRED EMBODIMENT

Figure 1:
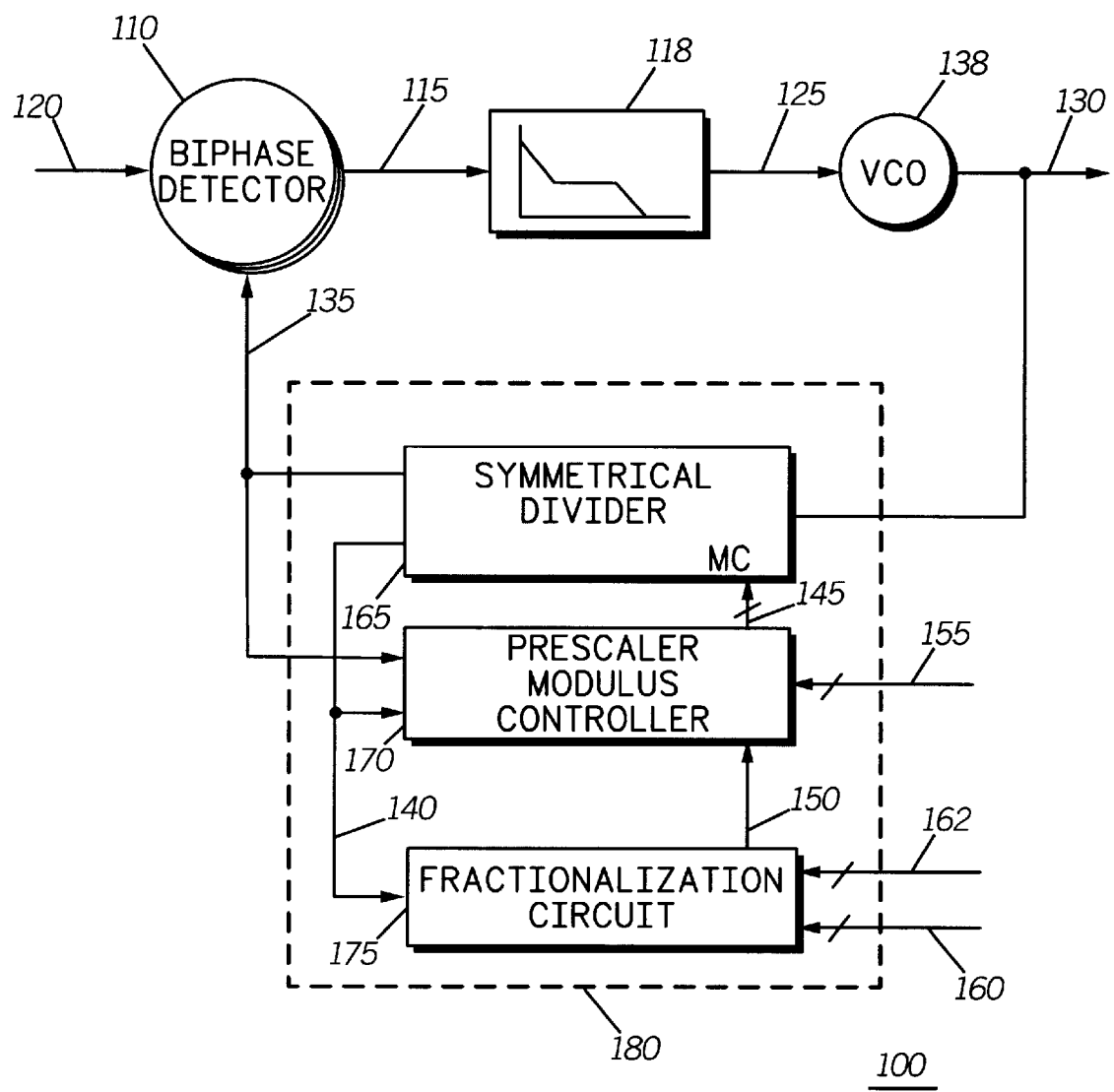
FIG. 1 is a block diagram of a fractional synthesizer, in accordance with the present invention.

FIG. 1 illustrates a preferred embodiment of a double resolution fractional N frequency synthesizer 100. A reference frequency 120 is coupled to one input of a biphase detector 110, and a divided frequency 135 is coupled to another input of the biphase detector 110. The reference frequency 120 incorporates a waveform that is symmetrical. The biphase detector 110 compares the phase difference of the reference frequency 120 and the divided frequency 135, and outputs an error signal 115 which represents the difference in phase between the two signals 120, 135. The biphase detector 110 is distinguished from a conventional tri-state phase detector in which only the positive or negative phase transitions of the reference frequency 120 and the divided frequency are compared. The biphase detector compares the phase on both the negative and positive transitions of the reference frequency 120. The biphase detector 110 may be a mixer type phase detector, an exclusive-OR gate, or a biphase tri-state detector as described below.

The error signal 115 is passed through a low pass filter 118 to produce a filtered error signal 125 that is inputted to a voltage control oscillator (VCO) 138. The low pass filter 118 is used to attenuate unwanted spurious signals. The VCO 138 produces an output frequency signal 130 which corresponds to the voltage level of the filtered error signal 125. The output frequency signal 130 is coupled to a symmetrical divider 165 which produces the divided frequency 135. Preferably, the divided frequency 135 has a symmetrical waveform, or fifty percent (50%) duty cycle, so that when compared to the symmetrical reference frequency 120 (by the biphase detector 110), no spurious errors signals result due to mismatches in the shapes of the two waveforms.

The double resolution fractional N divider 180 includes a symmetrical divider 165 having an additional divided frequency output 140 that is twice (2×) the divided frequency 135. The 2× divided frequency 140 is synchronous with the divided frequency 135 such that the positive edge transitions of the 2× divided frequency 140 are coincident with either the positive or negative edge transitions of the divided frequency 135. The 2× divided frequency 140 is used to drive resolution specification circuitry 170, 175 that comprises a prescaler modulus controller 170, and a fractionalization circuit 175. The fractionalization circuit 175 includes a provision for programming a numerator 160, and a denominator 162 to determine the fractional portion of the divide value. The divide modulus 145 may be varied over each half cycle of the divided frequency 135 in such a manner as to allow frequency division along half cycle units, or π radians, of the output frequency signal 130. The fractionalization circuit provides a fractionalization control signal 150 as an input to the prescaler modulus controller 170. The prescaler modulus controller 170 uses the fractionalization control signal 150 in combination with an integer value control signal 155, the divided frequency 135, and the 2× divided frequency 140 to generate a divide modulus or divisor 145. The integer value 155 is coupled to the prescaler modulus controller 170.

Figure 2:
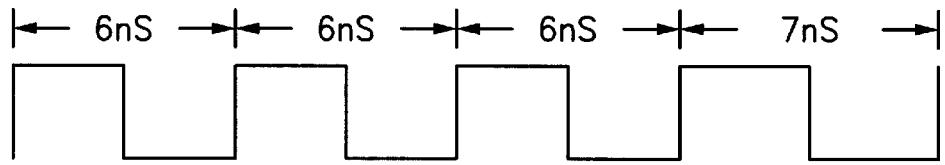
FIG. 2 is a waveform diagram of a fractionally divided signal generated using a conventional fractional synthesizer.
Figure 3:
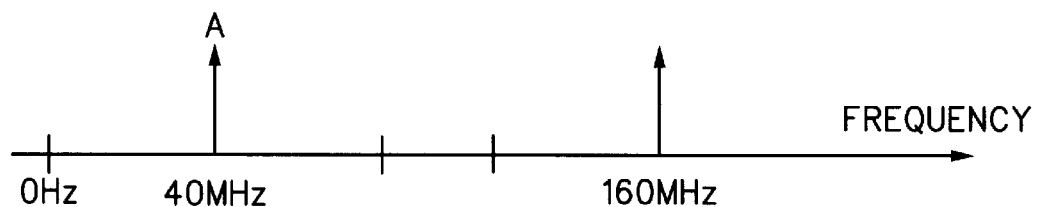
FIG. 3 is a frequency spectrum diagram the signal shown in FIG. 2.

FIG. 2 illustrates a fractionally divided waveform as conventionally generated. Here, three cycles of six nanoseconds (6 ns) are followed by one cycle of seven nanoseconds (7 ns) which, when taken together, are intended to generate a frequency of 160 megahertz. FIG. 3 is a frequency spectrum showing the resulting frequencies generated. Note that in addition to the intended frequency of 160 MHz, an additional frequency of 40 Mhz is generated at a particular amplitude (A). The 40 Mhz frequency represents an undesirable subharmonic frequency.

Figure 4:
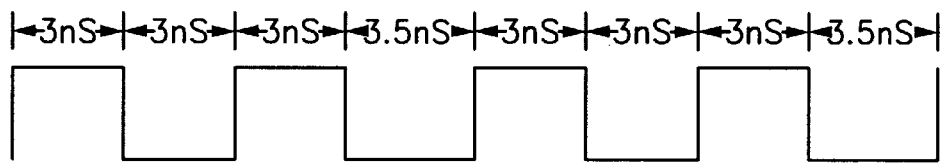
FIG. 4 is a waveform of a fractionally divided signal using a fractionalization technique, in accordance with the present invention.
Figure 5:
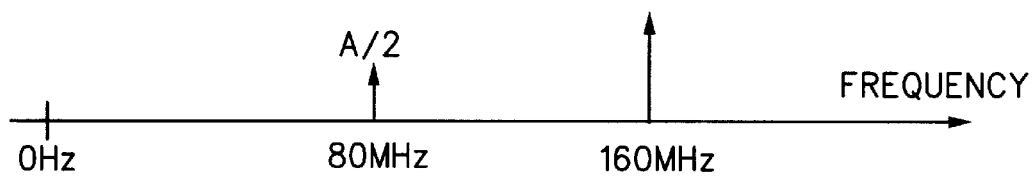
FIG. 5 is a frequency spectrum diagram corresponding to the fractionally divided signal of FIG. 4, in accordance with the present invention.

FIG. 4 illustrates a fractionally divided waveform used to generate a 160 Mhz frequency, in accordance with the present invention. Here, the divide modulus is specified for each half cycle and is varied as needed to produce the desired result. The resultant divided frequency, in this example, has in succession three half cycles of 3 ns; one half cycle of 3.5 ns; three half cycles of 3 ns; and one half cycle of 3.5 ns. FIG. 5 is a frequency spectrum diagram showing the generated frequencies. Note that a subharmonic frequency of 80 Mhz is generated instead of 40 Mhz, and at half the amplitude (A/2). Further, only two cycles (four half cycles) are required to accomplish the fractional frequency averaging. The increased subharmonic frequency and lower amplitude allows the performance of a fractional N frequency generator to be significantly improved, by allowing for increased loop bandwidth, particularly when the loop bandwidth is limited by subharmonic spurs.

Figure 6:
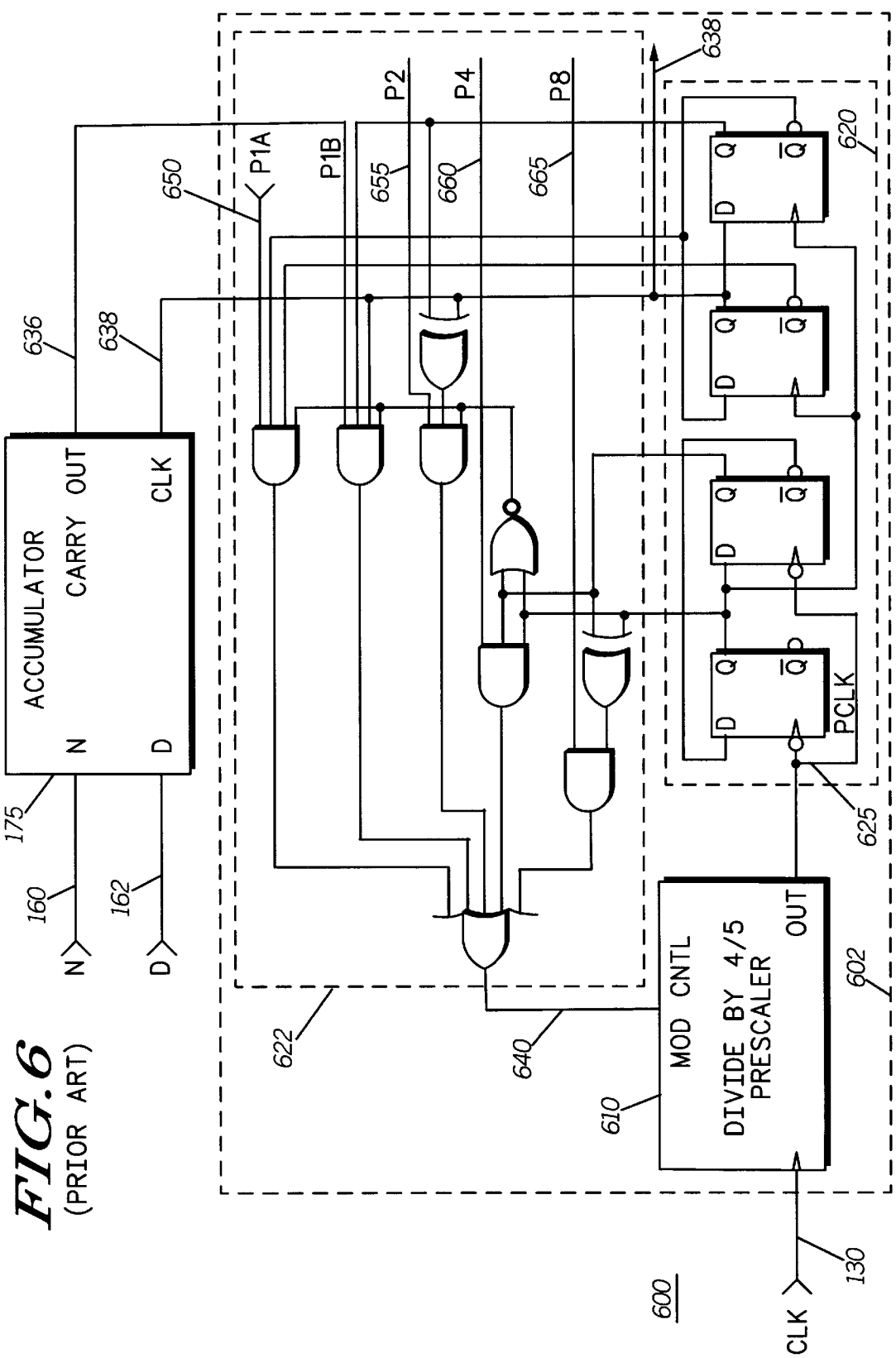
FIG. 6 depicts a prior art fractional loop divider.

FIG. 6 is a schematic diagram which illustrates a conventional fractional N loop divider 600 that provides an output signal 638. The fractional divider 600 incorporates an integer divider 602 which includes a dual modulus prescaler 610, having possible divide values of either 4 or 5. The prescaler output signal 625 is coupled to a fixed divider 620, which is embodied as a divide-by-16 circuit. A feedback network 622 combines the various states of the fixed divider 620, and a P8 programming bit 665, a P4 programming bit 660, a P2 programming bit 655, and a P1A programming bit 650, to generate a prescaler modulus control signal 640. The divide value is determined by multiplying the low modulus value of the dual modulus prescaler 610, which in this embodiment is 4, by the value of the fixed divider stage 620, which in this embodiment is 16. Consequently, the base divider value is 64. The P8, P4, P2, P1A, and P1B programming bits 665, 660, 655, 650, 636 add to the base divider value, when enabled, by periodically controlling the dual modulus prescaler 610 to divide by 5 instead of by 4. The P8 programming bit 665, when set to logic high, adds 8 to the base divider value of 64, for a programmed divide value of 72. The P4 programming bit 660 adds 4 to the base divider value, when set to logic high, and the P2 programming bit 655 and the P1A programming bit 650 add 2 and 1, respectively, to the base divider value when set to logic high.

The fractionalization circuit 175 is implemented using a single accumulator. The accumulator circuit 175 is coupled to the divider output 638 of the divider 600. The accumulator circuit 175 has a programmed denominator 162 which determines its capacity, and a programmed numerator 160 which determines the number by with the value of the accumulator circuit 175 increments at each positive transition of the divider output 638. The accumulator circuit 175 operates such that the numerator 160 value is added to the contents of the accumulator circuit 175 at each positive transition of the divider output 638. When the contents of the accumulator circuit 175 equal or exceed the value of the denominator 162, the carry out signal 636 is set to logic high, and any difference between the accumulator contents and the denominator 162 value, is left in the accumulator contents. The carry out signal 636 is set to logic high at a rate which reflects the fractional value of the numerator 160 divided by the denominator 162. The carry out signal 636 is coupled to the feedback network 622 such that one (1) is added to the base divider value whenever the carry out signal 636 is set to logic high.

Figure 7:
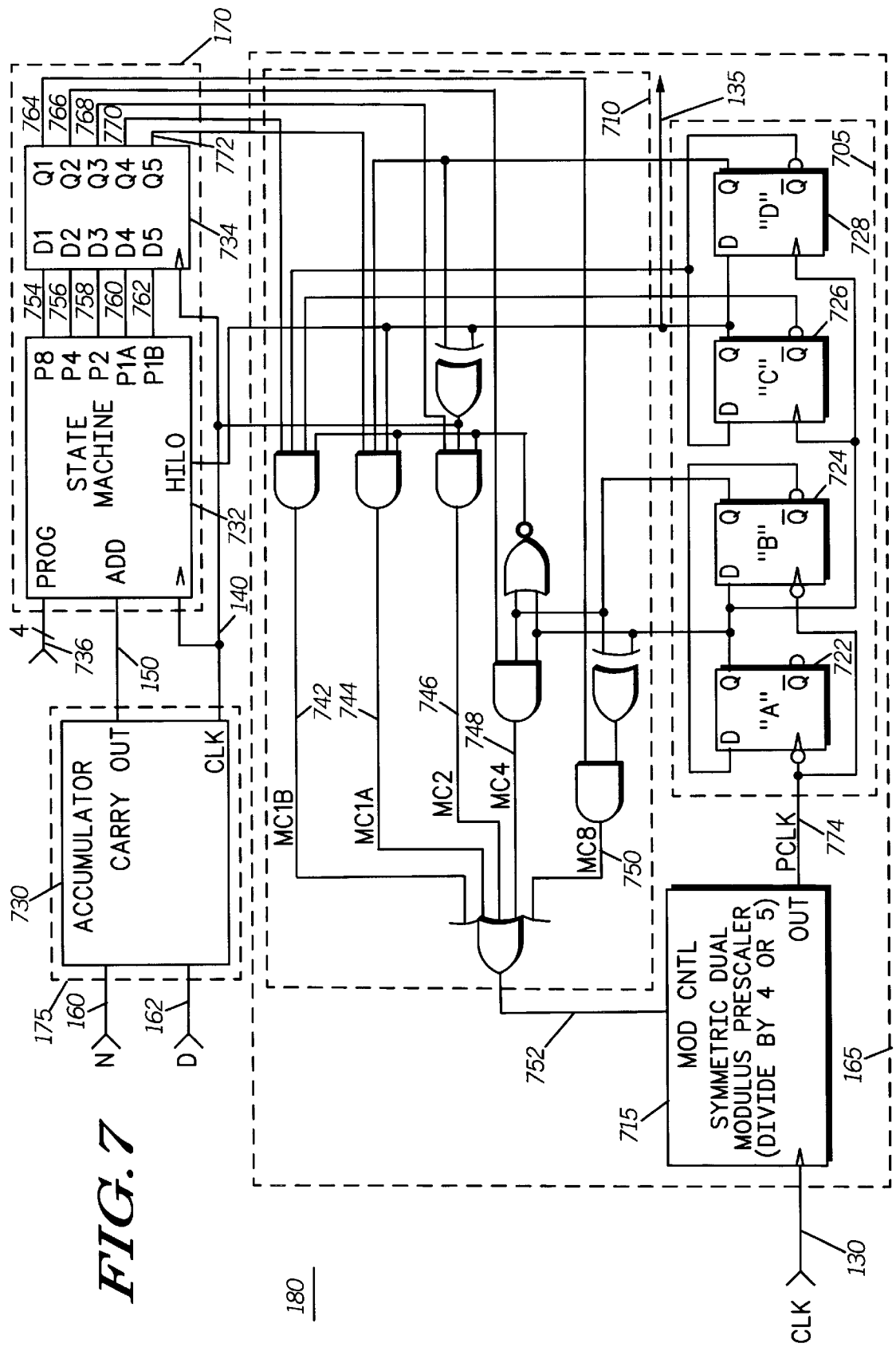
FIG. 7 depicts a fractional loop divider, in accordance with the present invention.

FIG. 7 is a schematic diagram of the fractional N loop divider 180, in accordance with the present invention. Here, significant details and interoperation of the symmetrical divider 165, the prescaler modulus controller 170, and the fractionalization circuit, are highlighted. The symmetrical divider 165 comprises a symmetric dual modulus prescaler 715, a fixed divider stage 705, and a feedback network 710. The prescaler modulus controller 170 comprises a state machine 732, and a set of data latches 734. The state machine 732 has five output signals 754, 756, 758, 760, and 762 which are coupled to the feedback network 710 through the set of data latches 734. The set of data latches 734 is used to reduce the possibility of data setup errors due to long propagation delays. The feedback network 710 and the fixed divider stage 705 are selected such that the divider output 135 has a symmetrical waveform for all possible integer divide values, which facilitates double resolution frequency synthesis. The fixed divider stage 705 includes a set of D-flip-flops 722, 724, 726, 728, labeled "A", "B", "C", and "D," respectively. A variety of divider ratios may be used to provide other configurations.

The control signals 764, 766, 768, 770, and 772, which are output by the set of data latches 734, propagate through a portion of the feedback network 710 to form the MC8 control signal 750, the MC4 control signal 748, the MC2 control signal 746, the MC1B control signal 742, and the MC1A control signal 744, respectively, which are OR'd together to form the prescaler modulus control signal 752. The PROG[3:0] bus 736 has a 4-bit width. The four signals which comprise the PROG[3:0] bus 736 determine the integer divide value of the divider, in a similar fashion as the programming bits 665, 660, 655, and 650 in FIG. 6. For the divider 165, however, the programming bits embodied in the PROG[3:0] bus 736, are first combined and manipulated in the state machine 732, when necessary, in order to accommodate the fractional signal 150. The fractional signal 150 comprises a number from the fractional circuit, or accumulator 730. This number has a range of values depending on the order, or type of fractional circuit used, and is periodically added to the programmed divider modulus. For a two-accumulator fractional circuit, the fractional signal 150, would be a number from the set: (−1, 0, 1, 2). For a single accumulator fractional circuit, the fractional signal 150, would be a number from the set: (0, 1). In general, higher order fractional circuits produce fractional signals which have a greater range of possible values to be added to the programmed divider modulus.

Figure 8:
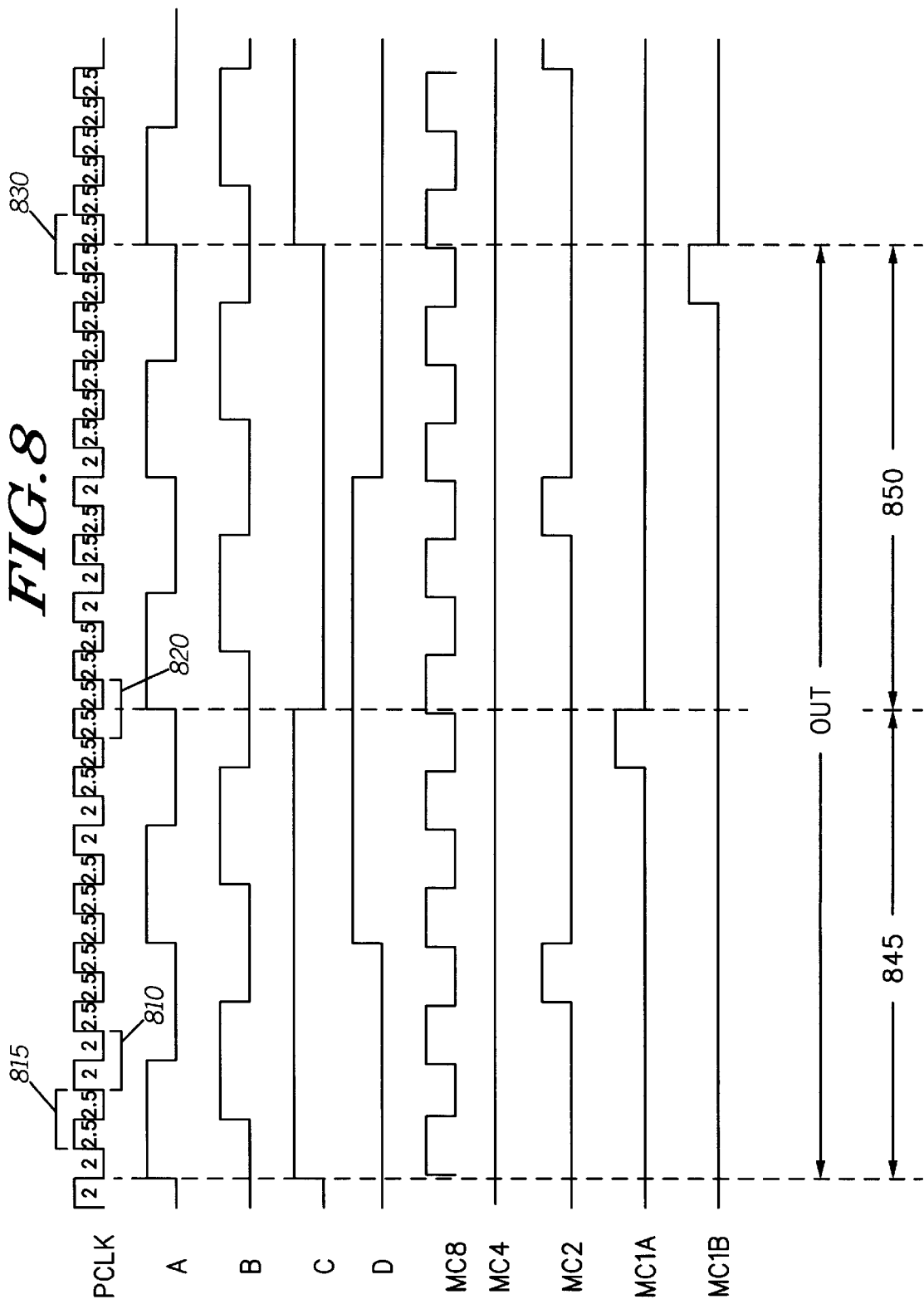
FIG. 8 is a waveform diagram illustrating a first example of double resolution operation, in accordance with the present invention.

FIG. 8 is a waveform diagram illustrating a sample operation of the double resolution divide circuit 180, in accordance with the present invention. Referring to FIG. 7 and FIG. 8, the circuit 180 adds a multiple of π radians (0.5 cycles) of the output frequency signal 130 to a half cycle of the divided frequency 135 waveform, as directed by the fractional circuit 175, or more specifically, by the accumulator 730. The four signals which comprise the PROG[3:0] bus 736 are set to a logical 1, 0, 1, and 1 respectively, so that the MC8 control signal 750, the MC2 control signal 746, and the MC1A control signal 744 is normally enabled. The PROG[3:0] bus 736 is therefore programmed to obtain the odd integer divide value of the base divide value: 4×16=64, plus the offset provided by the programming bits PROG[3:0] which is 8+2+1=11. Thus, the total integer divide value corresponds to a divide by 75. In FIG. 8, the divide frequency 135 waveform period is designated by "OUT", and the waveforms associated with the flip-flops 722, 724, 726, 728 are designated as "A", "B", "C", and "D," respectively. The divided frequency 135 waveform is the output of flip-flop 726, designated as "C" on the waveform diagram, and shown having two half cycles 845, 850. The prescaler output signal 774 is designated as "PCLK," and the MC8 control signal 750 is designated as "MC8", with the other control signals having a similar corresponding notation.

The duty cycle of "PCLK" 774 is shown for the divide by 4 mode 810 and the divide by 5 mode 815 of the prescaler 715. Note the symmetry of "PCLK" signal 774. In divide by 4 mode 810, each half cycle of "PCLK" is labeled with the value "2", which represents two cycles of the output frequency signal 130. In divide by 5 mode 815, each half cycle of "PCLK" is labeled with the value "2.5", which represents 2.5 cycles of the output frequency signal 130. The fractional circuit 175 adds π radians (0.5 cycles) of the output frequency signal 130 waveform to the half cycle of the divided frequency 135 designated by 850, where the divided frequency 135 waveform is logic low. During the logic low portion of the divided frequency 135 waveform, the state machine 732 swaps the MC1A control signal 744 from being active, and instead activate the MC1B control signal 742. It can be seen that if the two control signals 742, and 744 are swapped, then the MC1A control signal 744, and the MC1B control signal 742 each adds π radians of the output frequency signal 130 waveform to the logic low portion of the divided frequency 135 waveform. Normally, only π radians is added to the logic low portion 850 of the divided frequency 135 waveform by the MC1A control signal 744. In order to resume the normal programmed divide value, the MC1A control signal 744 remains deactivated, and the MC1B control signal 742 remains activated following the logic low portion 850 of the divided frequency 135 waveform. This condition is referred to as the "SWAP" state 1020 in the state diagram described below. If the fractional circuit 175 later attempts to add π radians to a half cycle of the divided frequency 135 waveform, the MC1A control signal 744 and MC1B control signal 742 may be swapped again, in accordance with the logic level of the divided frequency 135 at that time. It is also possible to subtract π radians from a particular half cycle of the divided frequency 135 waveform by swapping the MC1A control signal 744 and MC1B control signal 742.

The timing of the MC1A control signal 744, and the MC1B control signal 742 is significant in the operation of the double resolution divider 180, in that they occur during the transitions of the divided frequency 135 waveform. For instance, because the MC1A control signal 744 selectively occurs at the negative transition of the divided frequency 135 waveform, a corresponding prescaler output 774 waveform occurs such that one half cycle of the prescaler output 774 waveform is on either side of the divided frequency 135 waveform negative transition. Since the prescaler output 774 waveform is always symmetrical, π radians of the output frequency signal 130 waveform may be selectively added to both sides of the divided frequency 135 waveform negative transition. In short, transitions of the divided frequency 135 waveform occur during the middle of a cycle of "PCLK". This enables a half cycle (0.5) of the output frequency signal 130 waveform to be selectively added or subtracted to half cycles 845, 850 of the divided frequency 135 waveform by varying the value of the prescaler modulus 820, 830 that occurs during the transition of the divided frequency 135 waveform.

Figure 9:
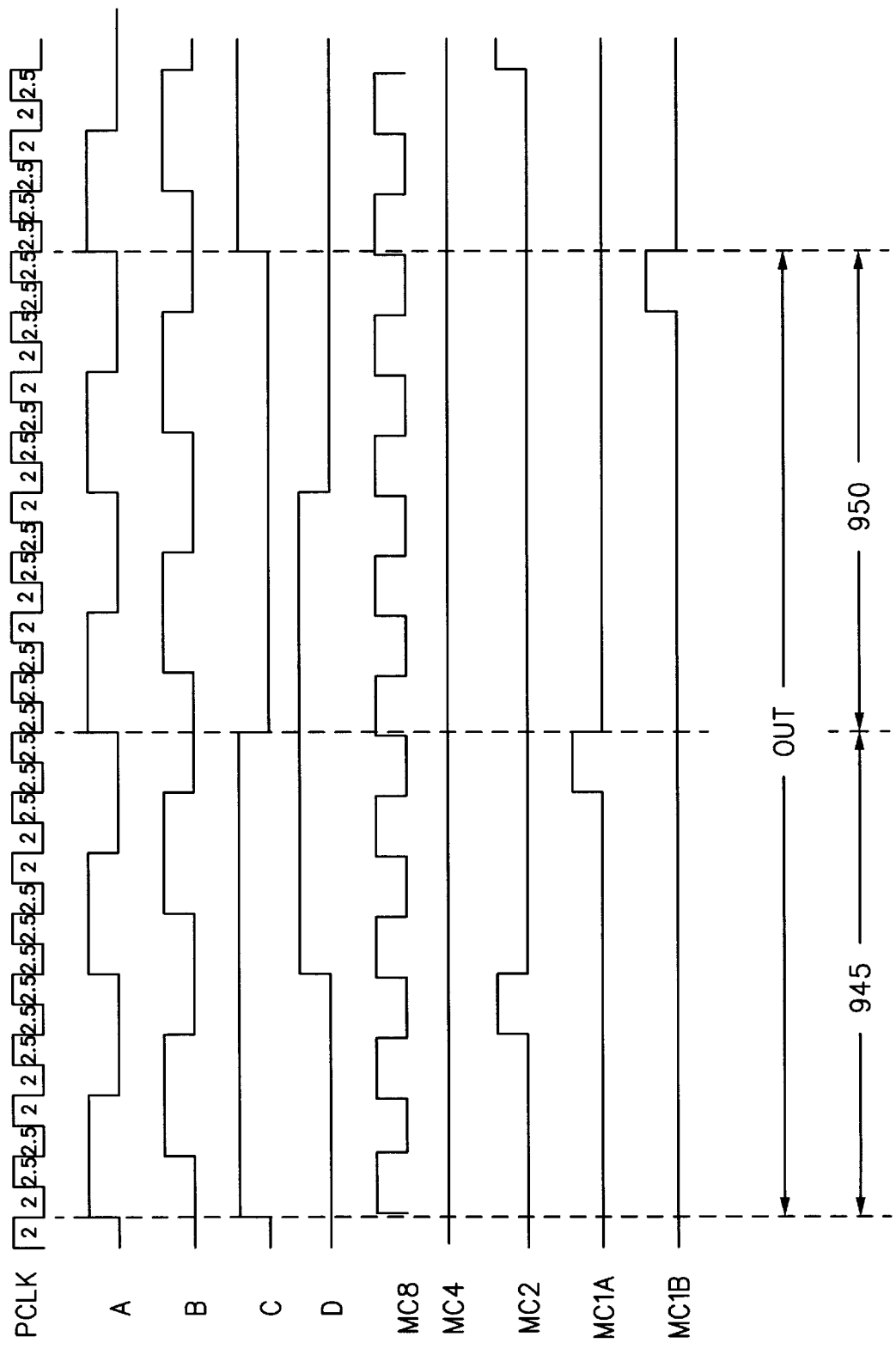
FIG. 9 is a waveform diagram illustrating a second example of double resolution operation, in accordance with the present invention.

When the symmetrical divider 165 is programmed for an even valued integer divide, such as divide by 74, the MC1A control signal 744 and the MC1B control signal 742, will not normally be activated. FIG. 9 is a timing diagram illustrating this operation. As in FIG. 8, the addition of π radians of the output frequency signal 130 waveform is made to a half cycle 945 (logic high) of the divided frequency 135 waveform. The MC1A control signal 744 and MC1B control signal 742 are both activated by the state machine 732, regardless of the polarity 945, 950 of the divided frequency 135 waveform. Afterwards, in order to resume the programmed integer divide value, the state machine 732 decrements the programmed value of the MC8 control signal 750, MC4 control signal 748, and the MC2 control signal 746. This condition is referred to as the "SUB1" state 1030 in the state diagram described below. A "SUB0" state 1010 occurs when no subtraction or swapping of control signals occurs, due to an odd valued number from the fractional circuit 175.

Figure 10:
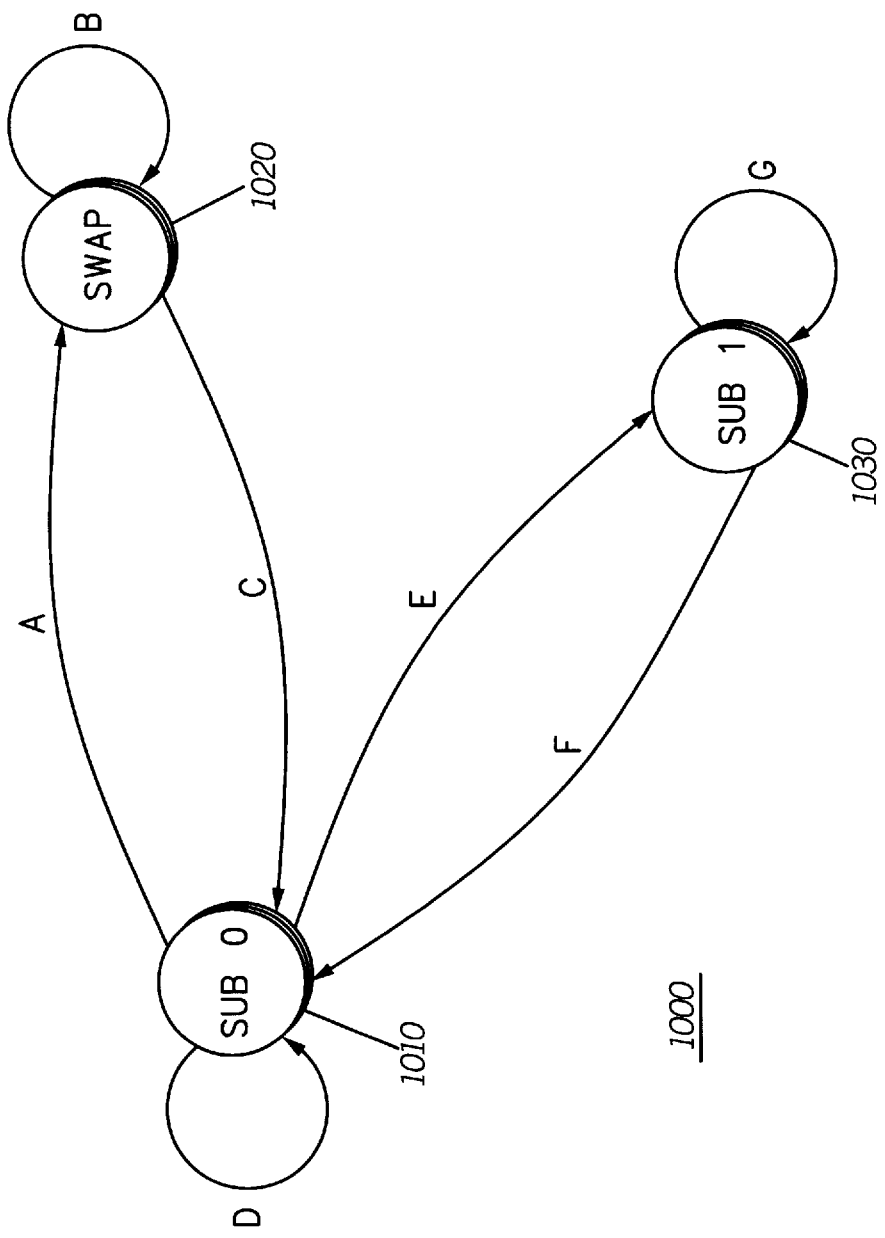
FIG. 10 is a state diagram describing the algorithm embodied in the state machine portion of the prescaler modulus controller, in accordance with the present invention.
Figure 11:
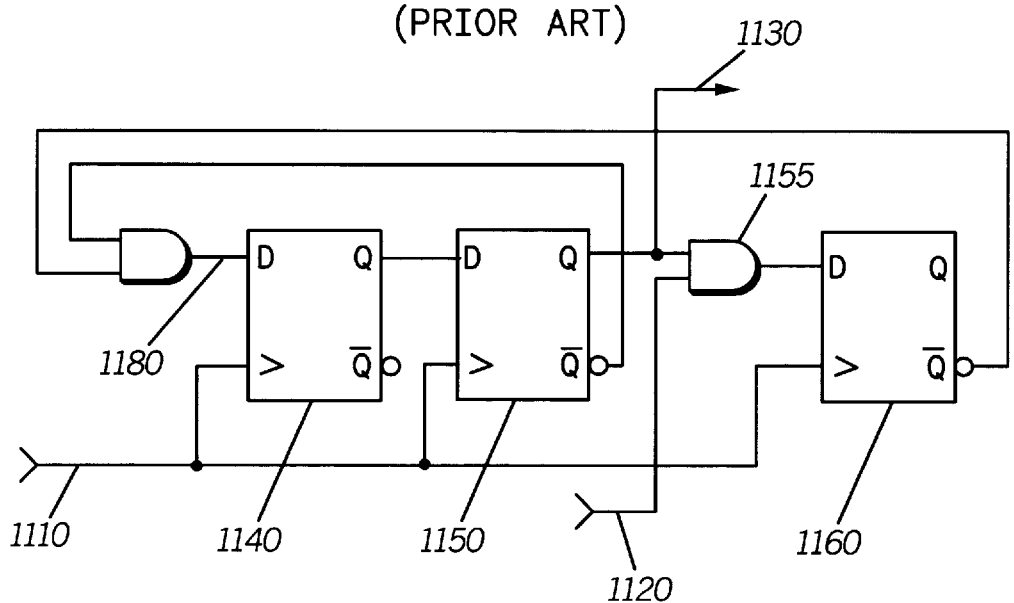
FIG. 11 depicts a prior art dual modulus prescaler.
Figure 12:
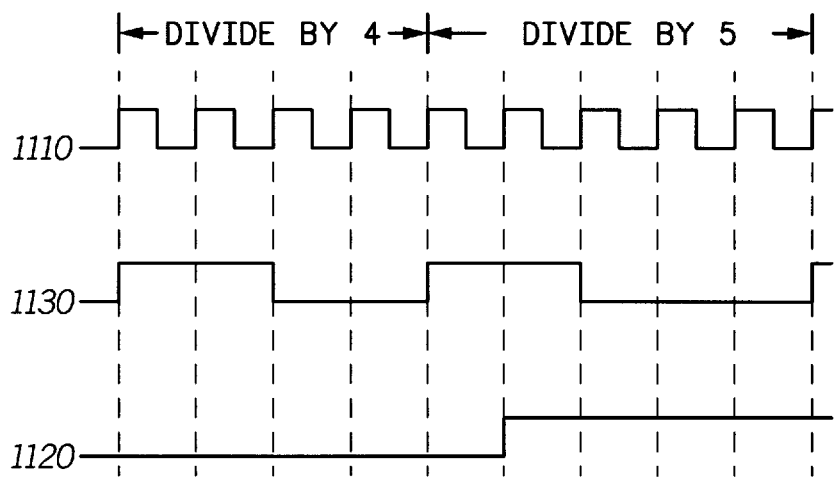
FIG. 12 is a waveform diagram depicting selected signals of the prescaler of FIG. 11.

FIG. 10 shows a state diagram 1000 that describes the algorithm embodied in the state machine 732 shown in FIG. 7. The state diagram 1000 illustrates the general method by which a symmetrical divider having a dual modulus symmetrical prescaler adds or subtracts any number of half cycles of an input frequency signal to or from any half cycle of a divided output frequency waveform. The state diagram 1000 indicates seven possible transitions labeled "A", "B", "C", "D", "E", "F", and "G," between three states 1010, 1020, 1030. For each transition, several different input conditions may trigger the transition, and consequently several different output conditions may result from a particular set of inputs. The inputs to a state machine embodying the state diagram 1000 are: 1) the programmed integer divide value PROG[3:0] bus 736; 2) the signed number that the fractional circuit 175 adds to the programmed integer divide value during a half cycle of the divided frequency 135 waveform; and 3) the current logic level of the divided frequency 135 waveform. The outputs of the state machine are: 1) the control signals P2, P4, and P8 which are not timed to correspond to the transitions of the divided frequency 135 waveform; 2) the P1A control signal 760 which is timed to correspond to the negative transition of the divided frequency 135 waveform; and 3) the P1B control signal 762 which is timed to correspond to the positive transition of the divided frequency 135 waveform. The inputs and outputs of the state machine 732 and the corresponding state diagram 1000 for any transition are summarized in the following table:

| TRANS. | INPUTS (1) | (2) | (3) | OUTPUTS (1) | (2) | (3) |
|---|---|---|---|---|---|---|
| A | Odd | −No | Hi | (PN~P2) − Int(No/2) | 0 | 1 |
| A | Odd | −No | Lo | (PN~P2) − Int(No/2) − 1 | 0 | 1 |
| A | Odd | No | Hi | (PN~P2) + Int(No/2) + 1 | 0 | 1 |
| A | Odd | No | Lo | (PN~P2) + Int(No/2) | 0 | 1 |
| B | Odd | −Ne | * | (PN~P2) − (Ne/2) | 0 | 1 |
| B | Odd | Zero | * | (PN~P2) | 0 | 1 |
| B | Odd | Ne | * | (PN~P2) + (Ne/2) | 0 | 1 |
| C | Odd | −No | Hi | (PN~P2) − Int(No/2) − 1 | 1 | 0 |
| C | Odd | −No | Lo | (PN~P2) − Int(No/2) | 1 | 0 |
| C | Odd | No | Hi | (PN~P2) + Int(No/2) | 1 | 0 |
| C | Odd | No | Lo | (PN~P2) + Int(No/2) + 1 | 1 | 0 |
| C | Even | * | * | * | * | * |
| D | Even | Zero | * | (PN~P2) | 0 | 0 |
| D | Odd | Zero | * | (PN~P2) | 1 | 0 |
| D | * | −Ne | * | (PN~P2) − (Ne/2) | 0 | 0 |
| D | * | Ne | * | (PN~P2) + (Ne/2) | 1 | 0 |
| E | Even | No | * | (PN~P2) + Int(No/2) | 1 | 1 |
| E | Even | −No | * | (PN~P2) − Int(No/2) − 1 | 1 | 1 |
| F | Even | No | * | (PN~P2) + Int(No/2) | 0 | 0 |
| F | Even | −No | * | (PN~P2) − Int(No/2) − 1 | 0 | 0 |
| F | Odd | * | * | * | * | * |
| G | Even | Ne | * | (PN~P2) + (Ne/2) − 1 | 1 | 1 |
| G | Even | Zero | * | (PN~P2) − 1 | 1 | 1 |
| G | Even | −Ne | * | (PN~P2) − (Ne/2) − 1 | 1 | 1 | where:
PN~P2: is an integer from 2 to N added to the base divide value;
Odd: is an odd valued programmed integer divide value 736;
Even: is an even valued programmed integer divide value 736;
No: is an odd valued number from the fractional circuit 175;
Ne: is an even valued number from the fractional circuit 175;
Int(No/2): is the integer result of No/2;
Hi: is logic high level of the divided frequency 135 waveform;
Lo: is the logic low level of the divided frequency 135 waveform;
*is a don't care value;
0: is a deactivated control signal;
1: is an activated control signal;

FIG. 11 illustrates a conventional dual modulus prescaler configuration. The input clock 1110 is coupled to first, second and third flip-flops 1140, 1150, and 1160 respectively. The first, second and third flip-flops 1140, 1150, 1160 are also serially coupled and provided with a feedback path 1180 in order to provide a frequency divide value of 4 or 5. As shown, the modulus control signal 1120 selectively couples the third flip-flop 1160 through the AND gate 1155, so that when the modulus control signal 1120 is low, a frequency divide value of 4 results, and when the modulus control signal 1120 is high, a frequency divide value of 5 results. As shown in FIG. 12, when the modulus control signal 1120 is logic low, the output signal 1130 is symmetrical, and when the modulus control signal 1120 is logic high, the output signal 1130 is non-symmetrical.

Figure 13:
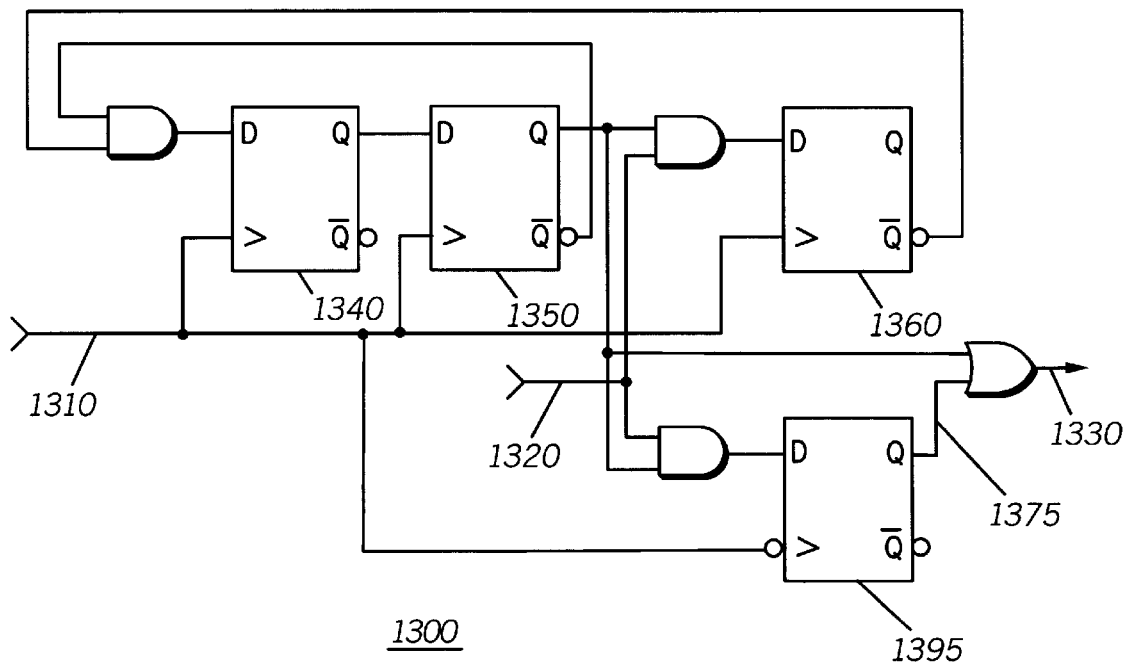
FIG. 13 depicts a first embodiment of a symmetrical dual modulus prescaler, in accordance with the present invention.
Figure 14:
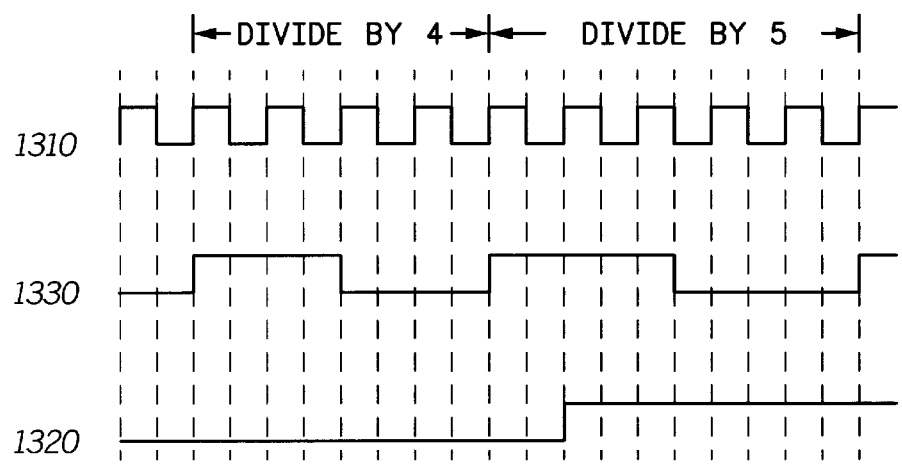
FIG. 14 is a waveform diagram depicting selected signals of the prescaler of FIG. 13.

FIG. 13 illustrates a first embodiment of a dual modulus prescaler 1300 which produces a symmetrical waveform for both even an odd valued frequency divides, in accordance with the present invention. Here, first, second, and third flip-flops 1340, 1350, 1360, are coupled similar to the circuit in FIG. 11. An additional flip-flop 1395 is selectively coupled to the second flip-flop 1350 through the modulus control signal 1320. The additional flip-flop 1395 is clocked on the opposite clock edge of input signal 1310, as compared to first, second and third flip-flops 1340, 1350, 1360. Also, the output signal 1330 is the logical OR of the output 1375 from the additional flip-flop 1395, and the output from the second flip-flop 1350. FIG. 14 shows a timing diagram illustrating that the output signal 1330 is symmetrical for a divide by 4 and a divide by 5.

Figure 15:
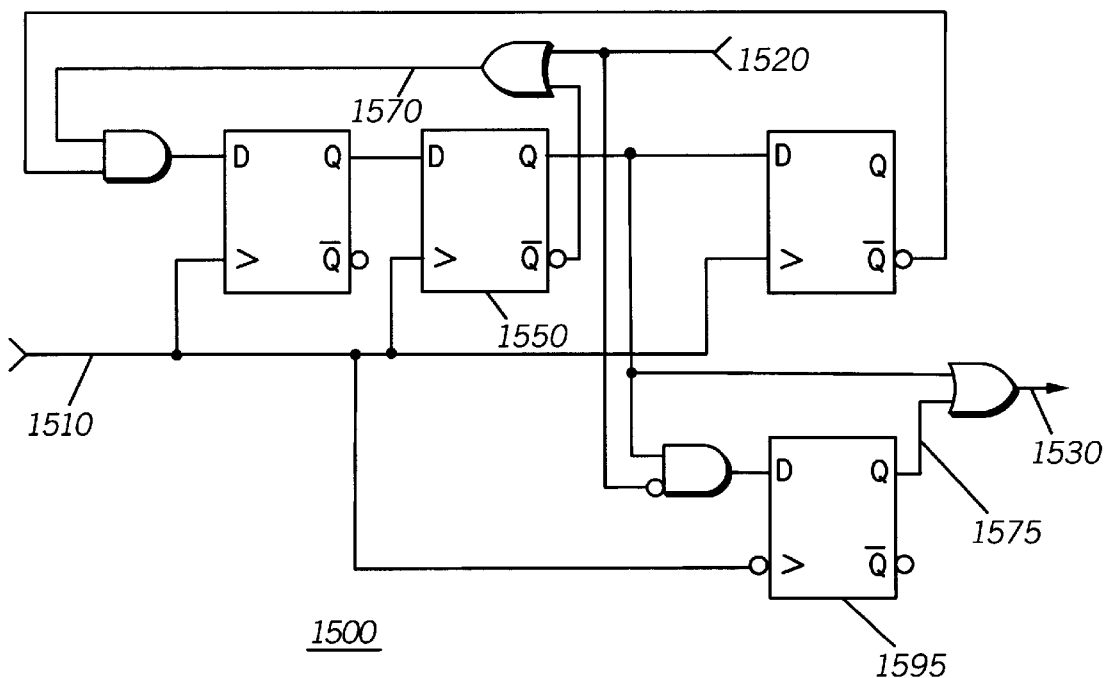
FIG. 15 depicts a second embodiment of a symmetrical dual modulus prescaler, in accordance with the present invention.
Figure 16:
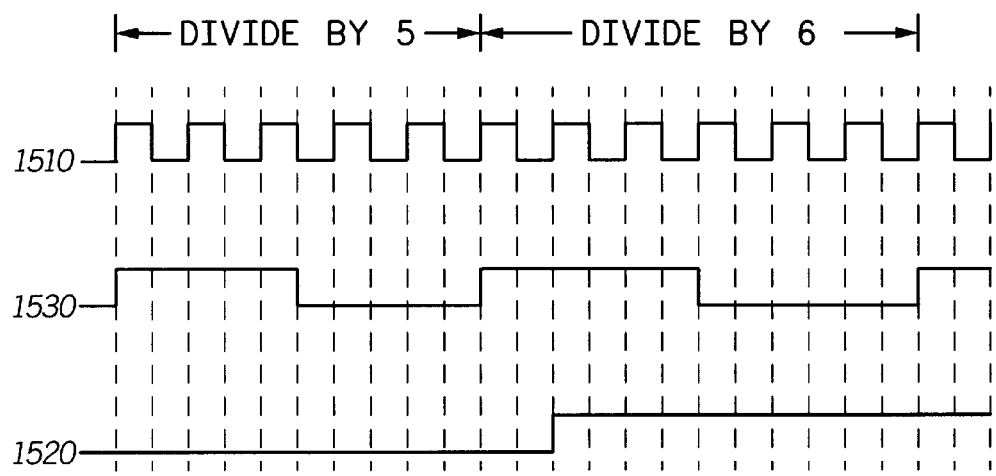
FIG. 16 is a waveform diagram depicting selected signals of the prescaler of FIG. 15.

FIG. 15 illustrates a second embodiment of a dual modulus prescaler 1500 that produces a symmetrical waveform for both even an odd valued frequency divides, in accordance with the present invention. In response to a clock signal 1510, the prescaler 1500 provides for a low divide value which is odd, and a high divide value which is even. The modulus control signal 1520 when high, enables the divider to provide a frequency divide of 6. When the modulus control signal 1520 is low, the divider provides a frequency divide of 5. A flip-flop 1595 provides a signal 1575 which is logically OR'd with a signal from flip-flop 1550 to generate an output signal 1530. The waveform diagram in FIG. 16 illustrates that the output signal 1530 is symmetrical for both the divide by 5 and the divide by 6 operation.

Figure 17:
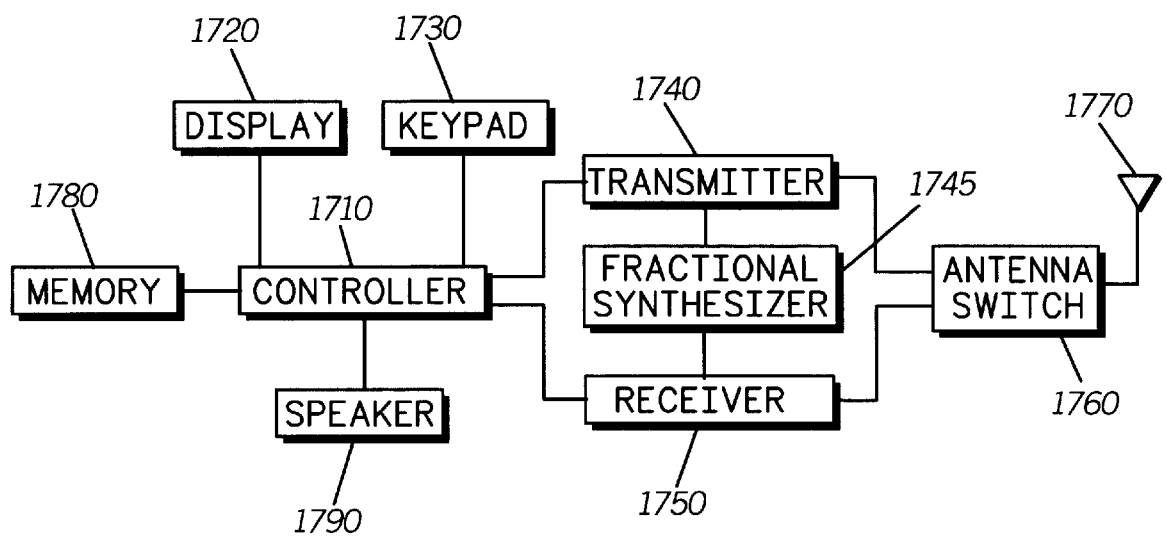
FIG. 17 is a block diagram of a radio incorporating a synthesizer, in accordance with the present invention.

FIG. 17 shows a block diagram of a radio communication device 1700, in accordance with the present invention. The communication device 1700 is preferably a two-way radio or radio telephone that is operable to provide telephone interconnect, dispatch, paging, private call and data services. In the radio 1700, a controller 1710 is coupled to a memory 1780, to a transmitter 1740, and to a receiver 1750, to provide communication circuitry. The transmitter 1740 and receiver 1750 are coupled to a fractional synthesizer 1745 formed in accordance with the present invention. The transmitter 1740 and the receiver are also coupled via an antenna switch 1760 to an antenna 1770. For transmit operations, the controller 1710 configures the antenna switch to couple the transmitter 1740 to the antenna 1770. Similarly, for receive operations, the controller 1710 couples the antenna 1770 via the antenna switch 1760 to the receiver 1750. Receive and transmit operations are conducted under instructions stored in the memory 1780. The radio 1700 also includes a display 1720, a keypad 1730, and a speaker 1790, that together provide a user interface for accessing radio functions.

A method and apparatus has been disclosed which enables a frequency synthesizer loop to fractionally synthesize an output frequency from a reference frequency based on half cycle periods, or π radians. The technique provides for subharmonic spurs which are twice in frequency and half in amplitude when compared to subharmonic spurs which would occur in a frequency synthesizer using a resolution based on 2π radian periods.

Numerous modifications, changes, variations, substitutions and equivalents will occur to those skilled in the art without departing from the spirit and scope of the present invention as defined by the appended claims.

What is claimed is:
1. A fractional frequency synthesizer, comprising:
   a divider having an input signal, and an output signal fractionalized based on half cycles of the input signal; and
   resolution specification circuitry coupled to the divider and providing a divisor for the divider that is variable based on half cycles of the output signal.
2. The fractional frequency synthesizer of claim 1, further comprising:
   a biphase detector;
   a filter coupled to the biphase detector; and
   a voltage controlled oscillator coupled to the filter and having an output coupled in a feedback path to the biphase detector;
   wherein the divider is coupled in the feedback path between the voltage controlled oscillator and the biphase detector.
3. The fractional frequency synthesizer of claim 1, wherein the resolution specification circuitry comprises a fractionalization circuit and a prescaler modulus controller coupled to the fractionalization circuit.

4. A dual modulus symmetrical divider responsive to a symmetrical input clock signal and a modulus control input signal, comprising:

first and second flip-flops each having a clock input port coupled to the symmetrical input clock signal, and both coupled in a feedback path to provide a divided signal;

a third flip-flop having a clock input port coupled to a complement of the symmetrical input clock signal, the third flip-flop having an input selectively coupled to the divided signal, and having an output of a delayed divided signal; and a combiner coupled to the first and third flip-flops having an output signal that is symmetrical;

wherein the modulus control input signal operates to selectively enable the feedback path to provide two different divide values, and to selectively couple the delayed divided signal and the divided signal at the combiner.

5. A frequency synthesizer circuit responsive to an input frequency signal, comprising:

a dual modulus symmetrical prescaler having a prescaler modulus comprising two adjacent integer divide values that are selectable, the prescaler having a prescaler input port coupled to the input frequency signal, and a prescaler output signal, the prescaler output signal having symmetrical output cycles, and a middle cycle transition delineating a half cycle point of each output cycle;

a symmetrical frequency divider, the symmetrical frequency divider having a frequency input port being coupled to the prescaler output signal, the symmetrical frequency divider producing a divided output signal having positive and negative transitions that are substantially coincident with the middle cycle transition; and a prescaler modulus controller that dynamically controls the prescaler modulus such that an increment corresponding to one half cycle of the input frequency signal is selectively added to a half cycle of the divided output signal.

6. The frequency synthesizer circuit of claim 5, wherein the symmetrical frequency divider includes first and second modulus control ports, the first modulus control port being coupled to control the prescaler modulus for one prescaler output cycle with a middle cycle transition occurring substantially coincident with a positive transition of the divided output signal, the second modulus control port being coupled to control the prescaler modulus for one prescaler output cycle with a middle cycle transition occurring substantially coincident with a negative transition of the divided output signal.

7. The frequency synthesizer circuit of claim 5, wherein prescaler modulus controller includes means for programming an integer divide offset value.

8. The frequency synthesizer circuit of claim 7, wherein prescaler modulus controller includes means for dynamically adding an offset number during each half cycle period of the divided output signal.

9. The frequency synthesizer circuit of claim 8, further comprising a fractionalization circuit that generates the offset number.

10. The frequency synthesizer circuit of claim 9, wherein the fractionalization circuit is coupled to the divided output signal, and includes at least one accumulator circuit having a programmable numerator and denominator.

11. A double resolution frequency synthesizer responsive to a symmetrical reference frequency signal, comprising:

a double resolution fractional frequency divider having a divider input port and producing a divided output frequency;

a biphase phase detector having first and second input ports, the first input port being coupled to receive the symmetrical reference frequency signal, the second input port being coupled to receive the divided output frequency, the biphase phase detector producing a phase error output signal; and a voltage controlled oscillator having a control input port being coupled to the phase error output signal, the voltage controlled oscillator producing an output frequency signal, the output frequency signal being coupled to the divider input port, the output frequency signal having a frequency which is a particular fractional multiple of the symmetrical reference frequency signal.

12. A radio, comprising:

communication circuitry that provides a reference frequency signal;

a fractional frequency synthesizer coupled to the reference frequency signal, and comprising:

a divider having a fifty percent duty cycle, the divider having an input signal, and an output signal fractionalized based on half cycles of the input signal; and resolution specification circuitry coupled to the divider and providing a divisor for the divider that is variable based on half cycles of the output signal.

* * * * *